United States Patent [19]

Baker et al.

[11] Patent Number: 4,845,540
[45] Date of Patent: Jul. 4, 1989

[54] IMAGING DEVICES COMPRISING PHOTODETECTOR ELEMENTS

[75] Inventors: Ian M. Baker, Romsey, Hants; Raymond E. J. King, Chandlersford, both of England

[73] Assignee: U.S. Philips Corp., New York, N.Y.

[21] Appl. No.: 907,691

[22] Filed: Sep. 15, 1986

[30] Foreign Application Priority Data

Sep. 20, 1985 [GB] United Kingdom ................. 8523362

[51] Int. Cl.$^4$ ...................... H01L 27/14; H01L 29/78
[52] U.S. Cl. ......................................... 357/24; 357/30
[58] Field of Search .......................................... 357/24

[56] References Cited

U.S. PATENT DOCUMENTS 4,093,872  6/1988  Hartman ............................... 357/24
4,521,798  6/1988  Baker ................................... 357/24

FOREIGN PATENT DOCUMENTS 0128828 12/1984 European Pat. Off. .

OTHER PUBLICATIONS

IEEE 1978 International Electron Device Meeting, pp. 510–512.

Primary Examiner—Robert S. Macon
Attorney, Agent, or Firm—William L. Botjer

[57] ABSTRACT

In an imaging device, photocurrent generated by detector elements (1), e.g. cadmium mercury telluride photodiodes, may be integrated in resettable capacitors (2), and an output signal (S) may be derived by reading the potential of the capacitor (2) at the end of its integration period, e.g. using a source-follower MOST (3). In accordance with the invention first and second capacitors (2a and 2b) are switchably coupled in alternate parallel arms between each detector element (1) and the voltage-reading means (3), by means of an arrangement of input gates (8a and 8b) and output gates (9a and 9b). Since one of the first and second capacitors (2a or 2b) can be coupled to the detector element (1) while the other (2b or 2a) is coupled to the voltage-reading means (3), each detector element (1) can be switched from one to the other so as to be operated the whole time for photodetection without its signal being lost (i.e. not integrated) when reading the previous output signal from that detector element (1). This is particularly useful for coupling a row of storage capacitors via a 2-d switching array to a 2-d array of infrared detector elements (1). A similar arrangement of alternately-switchable first and second capacitors (2a and 2b) may be used for visible light imaging, and a modified arrangement may used with a CCD signal processing circuit.

9 Claims, 4 Drawing Sheets

IMAGING DEVICES COMPRISING PHOTODETECTOR ELEMENTS

BACKGROUND OF THE INVENTION

This invention relates to imaging devices, particularly but not exclusively so-called hybrid devices which may comprise infrared detector elements of, for example, cadmium mercury telluride coupled to charge-integration means in, for example, a silicon circuit body. Such devices may be used in so-called "solid-state" video cameras and may operate at infrared wavelengths, for example in the 3 to 5 µm (micrometers) or 8 to 14 µm bands.

In European patent application (EP-A) No. 0 128 828, there is disclosed an imaging device comprising (a) a plurality of photodetector elements which generate charge carriers in response to incident photon radiation, (b) charge-integration means coupled to each photodetector element for temporarily storing and so integrating charge generated at that detector element during an integration period, (c) signal-deriving means for deriving a signal from said charge-integration means in accordance with the amount of charge integrated at the charge-integration means, and (d) reset means for resetting the charge-integration means before the beginning of each integration period.

In the devices disclosed in EP-A No. 0 128 828, the current from each detector element is integrated on an associated capacitor and an output signal is derived by measuring the capacitor potential using individual voltage-reading means (for example source-follower MOS transistors M11, M21, M31, M41 in FIG. 1 of EP-A No. 0 128 828) which are individually sequentially switched (for example by addressing MOS transistors M12, M22, M32, M42 in FIG. 1 of EP-A No. 0 128 828). Individual reset means (for example MOS transistors M13, M23, M33, M43 in FIG. 1) are associated with each capacitor and in particular EP-A No. 0 128 828 discloses an interconnection of the individual switching means (for example M22) with the individual reset means (for example M13) of the preceding capacitor so that as the voltage from one capacitor is read the preceding capacitor is reset. This provides a simple automatic arrangement for resetting the preceding capacitor, but it has been noted by one of the present inventors that when there is a variation in the supplied reset voltage (due to noise or interference, for example) a corresponding variation of the output signal can result when the reset capacitor is subsequently read. Since the integration time for the imaging devices in EP-A No. 0 128 828 excludes the reset time, the signals from different detector elements are integrated at different times so that the detector elements do not stare coincidentally.

SUMMARY OF THE INVENTION

According to the present invention, there is provided an imaging device comprising (a) a plurality of photodetector elements which generate charge carriers in response to incident photon radiation, (b) charge-integration means coupled to each photodetector element for temporarily storing and so integrating charge generated at that detector element during an integration period, (c) signal-deriving means for deriving a signal from said charge-integration means in accordance with the amount of charge integrated at the charge-integration means, and (d) reset means for resetting the charge-integration means before the beginning of each integration period, the device being characterised in that first and second charge-integration means are switchably coupled in alternate parallel arms between each detector element and the signal-deriving means by means of a switching arrangement which has input gates from the detector element and output gates to the signal-deriving means so permitting one of the first and second charge-integration means to be coupled to its detector element but isolated from the signal-deriving means while the other of the first and second charge-integration means is coupled to the signal deriving means but isolated from the detector element.

Since one of the first and second charge-integration means can be coupled to the detector element while the other is coupled to the signal-deriving means, each detector element can be switched from one to the other so as to be operated the whole time for photodetection without its signal being lost (i.e. not integrated) when reading the previous output signal from that detector element. Therefore, in a device in accordance with the invention, all the detector elements which may be exposed in one line can stare at the scene at the same time. This is particularly useful for infrared imaging where the charge signal generated at the detector elements is usually considerably greater than for visible light imaging.

Imaging devices in accordance with the invention may be designed for operation at visible light wavelengths or at infrared wavelengths. In the latter case, the detector elements may be most conveniently formed as photovoltaic infrared detector elements operated in zero-bias condition, and, in addition to the input gates of said switching arrangement, an injection gate may be present for controlling the radiation-generated signal injected from the detector elements to the charge-integration means so as to maintain the detector elements in the zero-bias condition.

It is preferable to have separate injection and input gates rather than designing a single gate which would be a compromise of the quite different switching and control functions of the two (injection and input) gates. Furthermore it is preferable to include the injection gate between the charge-integration means and its input gate, rather than designing a common injection gate between the detector elements and the input gates which because of the large capacitance of such a common injection gate could result in signal confusion before the signals are switched via the input gates into their respective charge-integration means.

The switching arrangement of the input and output gates may be conveniently controlled by the outputs of one or more flip-flop circuits which can be formed quite simply in the signal-processing circuit body of the device. Thus, a first output of such a flip-flop circuit may be connected to the input gate of the first charge-integration means and to the output gate of the second charge-integration means, and an inverse second output of the flip-flop circuit may be connected to the input gate of the second charge-integration means and to the output gate of the first charge-integration means.

First and second charge-integration means switchably coupled in accordance with the present invention, in alternate parallel arms between each detector element and the signal-deriving means, may be incorporated in devices where the signal processing is by charge transfer between storage gates, for example in charge-coupled devices. The invention may also be incorporated in imaging devices such as disclosed in EP-A No. 0 128 828 using capacitor means for the charge storage and integration and voltage-reading means (for example source-follower MOS transistors) to produce an output signal by reading the potential at the capacitor means which corresponds to the current integrated at the capacitor means. This mode of signal processing avoids certain disadvantages of charge-coupled devices in requiring high operating voltages, in introducing charge-transfer noise between successive stages of the CCD and in limiting the signal handling capability to values which are sometimes significantly less than what is desirable particularly for infrared imaging.

However, as mentioned hereinbefore, in the imaging devices disclosed in EP-A No. 0 128 828 each cell (formed by a capacitor means coupled to a detector element) is provided with its own individual voltage-reading means (for example a source-follower MOS transistor M11, M21, M31, M41 in FIG. 1 of EP-A No. 0 128 828) which is individually sequentially switched (for example by an addressing MOS transistor M12, M22, M32, M42 in FIG. 2 of EP-A No. 0 128 828). There is also individual reset means (for example MOS transistors M13, M23, M33, M43 in FIG. 1) associated with each cell. Apart from other disadvantages relating to device characteristics and performance, the provision of so many circuit elements associated with each cell can occupy a large area of the signal processing circuit body, particularly but not only for two-dimensional arrays (for example FIG. 3 of EP-A No. 0 128 828). Incorporation of the characterising features of the present invention adds still further circuit elements (for example at least a second capacitor and switching arrangement of input and output gates).

Preferably, therefore, the present invention is incorporated in a device having a less complex cell structure than those in EP-A No. 0 128 828. For this purpose there is a particularly convenient circuit arrangement based on capacitor storage and integration in which the voltage-reading means and the reset means are each common for the plurality of detector elements, and in which the capacitor means of each detector element is switchably coupled by means of the addressing and switching means to both said common voltage-reading means and said common reset means so as to switch each capacitor means sequentially to the common voltage-reading means and to reset sequentially the reference voltage level at each capacitor means and at the common voltage-reading means. This provides a compact circuit element structure for reading and resetting all the capacitor means so that additional circuit elements (for example at least a second capacitor means and switching arrangement of input and output gates) can be more readily incorporated in accordance with the present invention. It is also possible to include even further circuit elements to improve or extend the device performance (for example, blooming-protection means, or an expanded capacitor arrangement for increasing or varying the charge-integration capacity). Furthermore, such a signal-processing circuit having common voltage-reading means and common reset means can be interfaced in a compact arrangement with a switchable two-dimensional array of detector elements.

Thus, blooming-protection means may be coupled to each capacitor of the charge-integration means to inhibit inversion of the potential of the capacitor when the signal generated at the detector element exceeds a level sufficient to discharge fully the capacitor. The blooming-protection means may comprise first and second further gates which are associated with said first and second capacitors and are connected together to a common control voltage supply, and an electrode connection connected to a source of compensating current may be located between said first and second further gates so as to become coupled to either of the first and second capacitors when either of said first and second further gates becomes activated as a result of the first or second capacitors becoming fully discharged by excessive signal generated at the detector element.

The first and second charge-integration means of each detector element may each comprise at least two parallel-connected capacitor means, at least one of which has means permitting its connection to or disconnection from the other(s) so permitting a higher or lower total storage capacity to be obtained.

The plurality of detector elements may be arranged as a two-dimensional array, the detector elements being switchably connected via respective switches in a two-dimensional array of switches to signal paths which are coupled to the charge-integration means at least via the input gates.

BRIEF DESCRIPTION OF THE DRAWINGS

These and other features in accordance with the invention will be illustrated more specifically in embodiments of the invention now to be described, by way of example, with reference to the accompanying diagrammatic drawings, in which.

DETAILED DESCRIPTION OF THE PREFERRED EMBODIMENT

Figure 1:
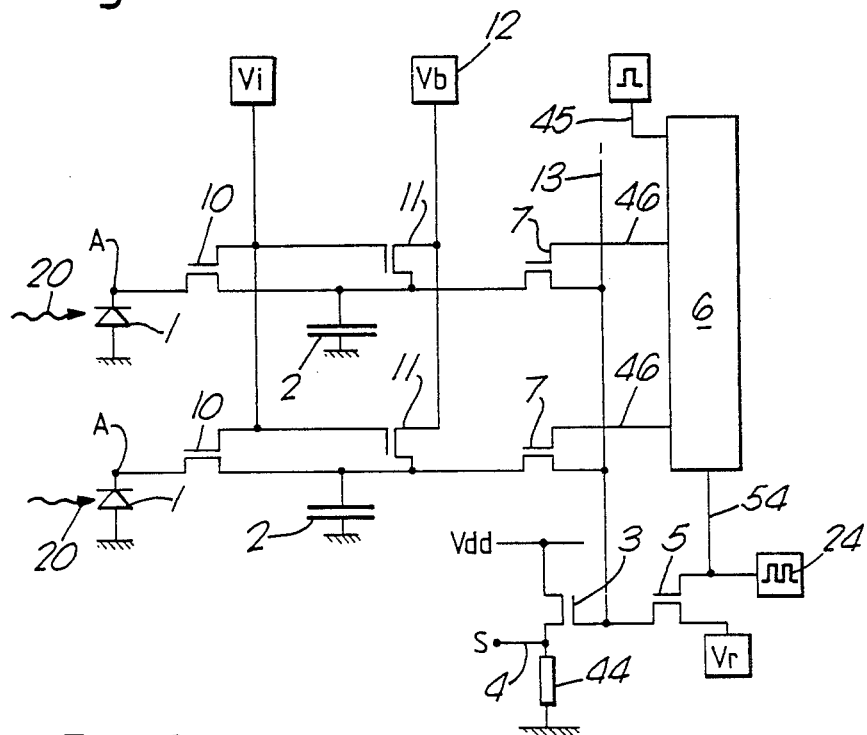
FIG. 1 is a circuit diagram of an infrared imaging device having storage capacitors with common voltage-reading means and common reset means.

It should be noted that all these Figures are diagrammatic. The plan and sectional views of FIGS. 3, 4, 5 and 6 are not drawn to scale but the relative dimensions and proportions of parts of these Figures have been shown exaggerated or diminished for the sake of clarity and convenience in the drawings. The same reference signs as used in one embodiment are generally used when referring to corresponding or similar parts in other embodiments.

Before describing the embodiment of the invention illustrated in FIG. 2, the simpler device arrangement of FIG. 1 will be described to provide a simple illustration of the basic type of device operation which is modified in FIG. 2 by the inclusion of alternately switchable storage capacitors 2a and 2b for each detector element 1. The infrared imaging device of FIG. 1 comprises a plurality of infrared detector elements 1 which generate photocurrent in response to incident infrared radiation 20. Capacitor means 2 are coupled to each detector element 1 for integrating the current generated at that detector element 1 during an integration period. An injection gate 10 controls injection of the current from the detector element 1 to the capacitor means 2.

Voltage-reading means 3 are coupled between the capacitor means 2 and a signal output 4 to produce an output signal S by reading the potential at the capacitor means 2 corresponding to the amount of current integrated at the capacitor means 2. Reset means 5 are coupled to the capacitor means 2 for resetting the capacitor means 2 to a reference voltage level Vr before the beginning of each integration period. Addressing and switching means 6,7 permit the output signals S corresponding to the plurality of detector elements 1 to occur sequentially at the signal output 4 and permit the capacitor means 2 of the detector elements 1 to be sequentially reset. In this device, the voltage-reading means 3 and the reset means 5 are each common for the plurality of detector elements 1, and the capacitor means 2 of each detector element 1 is switchably coupled by means of the addressing and switching means 6,7 to both the common voltage-reading means 3 and the common reset means 5 so as to switch each capacitor means 2 sequentially to the common voltage-reading means 3 and to reset sequentially the reference voltage level Vr at each capacitor means 2 and at the common voltage-reading means 3.

This form of device illustrated in FIG. 1 and having common voltage-reading means and common reset means presents a significant improvement in performance over the devices disclosed in EP-A No. 0 128 828 having individual voltage-reading means and individual reset means for each capacitor means. Because the device of FIG. 1 does not have these individual circuit elements associated with each capacitor means, it is much easier (in terms of layout and body area) to incorporate further circuit elements in accordance with the present invention into the FIG. 1 form of device rather than into those disclosed in EP-A No. 0 128 828. Thus, FIG. 2 illustrates such a modification of the FIG. 1 arrangement, in which, in accordance with the present invention, first and second charge-integration means 2a and 2b are switchably coupled in alternate parallel arms between each detector element 1 and the signal-deriving means formed by the common voltage-reading means 3 in FIG. 1. This switchable coupling is achieved by means of a switching arrangement which has input gates 8a and 8b from the detector element 1 and output gates 9a and 9b to the signal-deriving means 3 so permitting one of the first and second charge-integration means 2a and 2b to be coupled to its detector element 1 but isolated from the signal-deriving means 3 while the other of the first and second charge-integration means 2b or 2a is coupled to the signal-deriving means 3 but isolated from the detector element 1. The devices of FIGS. 1 and 2 also include further circuit elements to provide blooming-protection means 11,12.

The drawings only show, for the sake of convenience, a small number of detector elements 1 and their signal processing. However, in practice, these imaging devices will have a large number of such detector elements 1 and corresponding signal processing circuitry. Thus, the devices of FIGS. 1 and 2 may be used in infrared video cameras having, for example, linear arrays of 32 or 64 or even 128 detector elements 1 across which the scene which is being viewed in the infrared is imaged and raster-scanned in known manner by means of lenses and progressively stepped reflectors. Depending on the type of camera and imaging system, the scan direction may be in the longitudinal direction of the linear array or perpendicular to that direction.

The detector elements 1 may be photovoltaic diodes of known type formed in a common body 30 (see FIG. 3) of cadmium mercury telluride, the composition of which can be chosen for operation in, for example, the 3 to 5 $\mu$m waveband or the 8 to 14 $\mu$m waveband. The bulk of the body 30 may be of p type material at the detector operating temperature, for example 70° K. for the 8 to 14 $\mu$m waveband. Each detector element may comprise an n type region 31 forming a p-n diode junction with the p type bulk. The common p type bulk of the detector elements 1 may be connected to earth potential, and the individual output signals of each photovoltaic element 1 are taken as currents from the n type regions 31 via, for example, wire connections 32 to the inputs A of a silicon circuit body 33 containing the signal processing circuitry. For the sake of convenience, FIG. 3 does not show electrode metallizations for the n type regions 31 and for the p type bulk of body 30, but these may be provided in a variety of known manners.

Figure 2:
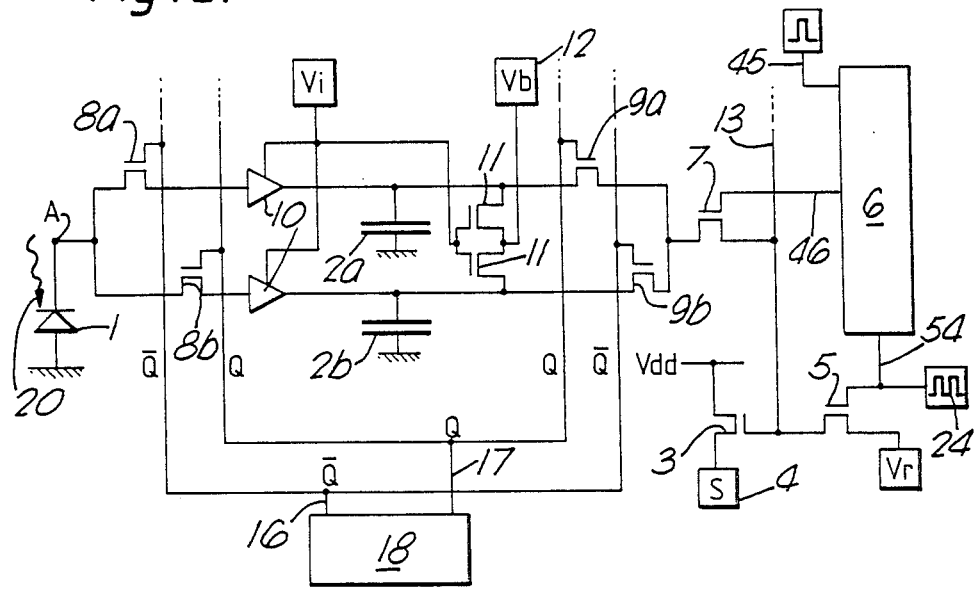
FIG. 2 is a circuit diagram of a device in accordance with the present invention shown as a modification of the device of FIG. 1.
Figure 3:
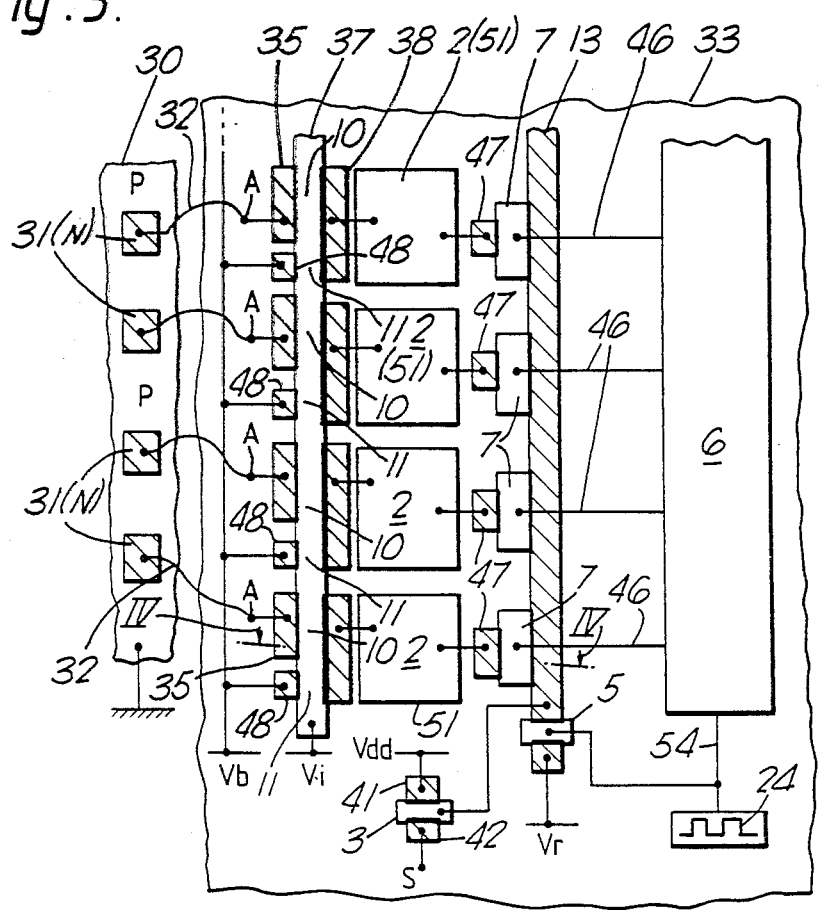
FIG. 3 is a plan view of one possible layout for part of the device of FIG. 1.
Figure 4:
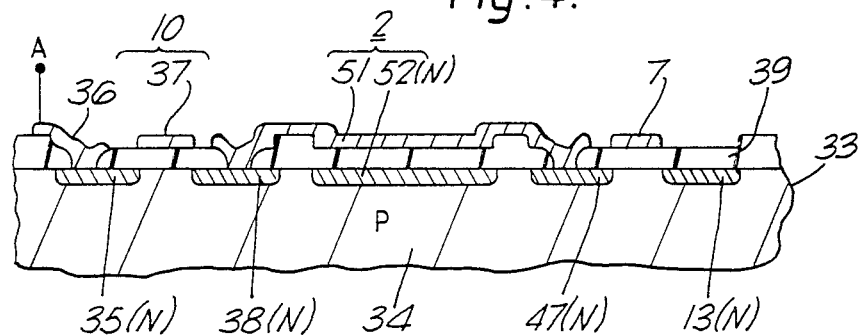
FIG. 4 is a cross-section on the line IV—IV of FIG. 3 showing one form of integrated circuit technology which may be used to fabricate the signal-processing circuitry part of the device of FIG. 1.

All the signal processing circuitry illustrated in FIGS. 1 and 2 may be formed in a single silicon circuit body 33. The capacitor means 2 of the detector elements 1 are located in a row and are switchably coupled to a common signal line 13 at a location along which the common voltage-reading means 3 and common reset means 5 are connected. The injection gate 10 of each detector element 1 is located on the other side of the row of capacitor means 2 and extends parallel to the line 13. As shown in FIGS. 3 and 4, the injection gates 10 may be fabricated as insulated-gate field-effect transistors having separate source zones 35 connected to each input A by electrode connections 36, insulated gates 10 formed by a common gate stripe 37 for the row of capacitor means 2, and separate drain zones 38 for each capacitor means 2. These transistors and, if so desired, the remainder of the signal-processing circuitry in body 33 may be formed using, for example, known n channel MOS integrated circuit technology. Thus, source and drain zones 35 and 38 may be n type regions in a p type portion of the silicon body 33, the individual transistors are isolated from each other in known manner at active areas defined by a thick field oxide layer 39 at the body surface, while a much thinner insulating layer is present below the active areas of the gates formed by tracks of, for example, doped polycrystalline silicon or a metal silicide.

In the form shown by way of example in FIGS. 3 to 6, the common signal line 13 is an n type stripe in the p type portion of the silicon body 33. In this case, the reset gate 5 can be a transistor switch formed by an insulated gate over a gap in the n type stripe 13 the interrupted parts of which provide the source and drain of the transistor, for example at one end of the line 13. In the plan views of FIGS. 3 and 5, n type regions are hatched, whereas insulated gate areas are unhatched. The common voltage-reading means 3 is (as shown in FIGS. 1 and 2) a source-follower field-effect transistor having an insulated gate 43 connected to the common signal line 13, an n type drain zone 41 connected to a voltage supply line Vdd (for example, at about 9 volts), and an n type source zone 42 connected to earth potential via a load transistor 44. This load 44 may be an n channel field effect transistor whose insulated gate and source are connected together in known manner. For the sake of convenience this load transistor structure is not shown in FIG. 3. The signal output 4 of the devices of FIGS. 1 and 2 is taken from the source zone 42 of the common voltage-reading transistor 3. An amplifier (which may also be formed in the body 33) may be connected to this output 4 to amplify the output signal S.

The addressing and sequential switching of the capacitor means 2 to the common signal line 13 is effected by means of a high speed shift register 6 having sequential outputs 46 connected to a plurality of insulated gates 7 located between the capacitor means 2 and the signal line 13. These gates 7 may be fabricated as transistor structures illustrated in FIGS. 3 to 6 having n type individual source zones 47 and a common drain zone formed by the n type signal line 13. The sequence of outputs 46 from the shift register 6 includes an initial (or final) output 45 which provides a line synchronisation pulse for the device signal S when the sequentially shifted output pulse from the register 6 appears at the output 45.

The capacitor means 2 for temporarily storing and integrating the charge signals from the detector elements 1 may be constructed in various ways. Thus, for example, using n channel MOS integrated circuit technology, the separately-connected storage plates of the individual capacitors may be formed by separate n type regions (for example regions 57 of FIGS. 6 and 7) but insulated from an overlying insulated gate stripe which is common for all the capacitors and which is connected to earth potential. However, the capacitance of the capacitor constructed in this way also includes that of the p-n junction between the n type region and the p type body portion 34, and this p-n junction capacitance varies with voltage. FIGS. 3 and 4 illustrate an inverted construction in which the separately-connected storage plates are insulated gate areas each connected between n type side regions formed by a drain region 38 of an injection gate transistor and an n type source region 47 of an addressing transistor 7. In this case there is a common n type stripe 52 which forms the bottom plate of the capacitors 2 and which is connected to earth potential. This construction is more complicated and may occupy more space, but its capacitance is much more stable with voltage. It is also possible to form the capacitor 2 wholly deposited on the surface of the body 33, for example as a metal plate deposited on a dielectric layer on a polycrystalline silicon layer in the insulating layer 39.

Due to its advantageous design, the operation of the device and circuit of FIG. 1 is comparatively simple. A low constant voltage Vi (for example, about 1 volt) is applied to the injection gates 10 to operate the input transistors 35-10-38 in known manner in the condition where the channel current of the transistor is controlled by the gate-to-source voltage so as to equal the detector element photocurrent, thereby maintaining the detector elements 1 in a zero-bias condition. In this way the injection gates 10 serve to stabilize the operation of the photodiodes 1 illuminated by the radiation 20.

The injected current signal is integrated on the capacitor 2. For this purpose, the capacitor 2 is charged before the beginning of the integration period by resetting its potential to the reference level Vr (for example, about 5 volts), after which it is isolated from the line 13 for the integration period. The capacitor 2 becomes at least partially discharged during the integration period by the current signal from the detector elements. The potential corresponding to the charge state of each capacitor 2 at the end of its integration period is read by coupling that capacitor 2 via its addressing gate 7 to the gate of the source-follower transistor 3. The gates 7 are sequentially addressed by an output pulse which appears sequentially on the outputs 46 of the shift register 6. In the arrangement illustrated in FIGS. 1 and 2, a source of clock voltage pulses 24 is connected to both the reset gate 5 and to an input 54 of the shift register 6. The potential of one capacitor 2 is read in the time interval between the pulses 24.

The threshold voltage of the reset gate 5 is chosen such that the rising edge of each pulse 24 triggers the gate 5 so that the reference voltage Vr is applied via the open addressing gate 7 to that one capacitor 2 which has just been read so resetting its voltage for its next integration period. At the same time (because the transistor drain of the reset gate 5 is connected to the insulated gate of the source-follower transistor 3) the reference voltage level Vr is also applied to the transistor 3 so that its output signal S changes from a value corresponding to the signal from that one capacitor to a value corresponding to Vr. In this manner the output signal from each capacitor is measured against the reset voltage level Vr (and not earth potential) so tending to cancel any variation occurring in the supplied level Vr due to, for example, noise.

The input 54 of the shift register 6 is so designed as to cause the falling edge of each pulse 24 to clock the shift register 6 so that the output pulse now appears on the next output 46 in the sequence. This triggers the switchable coupling of the next capacitor 2 in the sequence to the line 13 so that the potential corresponding to the charge state of this next capacitor is read by the source-follower transistor 3.

If the device of FIG. 1 is used to view a scene with a very hot spot, the current generated by at least one of the detector elements 1 may exceed a level sufficient to discharge fully the associated capacitor 2, and this excess current could invert the capacitor potential (so that it became negative) in the absence of anti-blooming means 11,12. The excess current can forward bias the p-n junction of this detector element so that it injects electrons into the p type bulk of the cadmium mercury telluride body 30 thereby producing an excessive charge signal at least at neighbouring detector elements 1 and possibly along most of the detector element row. However the device of FIG. 1 (and that of FIG. 2) is protected against such a blooming effect by having a further gate 11 between each capacitor 2 and a source 12 of compensating current to stabilize the potential of the capacitor 2 and its detector element 1.

The further gate 11 has the same threshold voltage as the injection gate 10 and is connected at the same control potential Vi. This is achieved in a simple manner in the layout of FIG. 3 by making the injection gates 10 and blooming-protection gates 11 as alternate integral parts of the common insulated gate stripe 37 and by forming source, drain and channel of the transistor structures which provide the injection gate 10 and further gate 11 using the same technology and in the same processing steps. Thus, the gates 11 form part of insulated-gate field-effect transistors each having source and drain formed by a separate n type region 48 and an n type region 38 which is common with the injection gates 10. Direct coupling between regions 35 and 48 is prevented in known manner by a channel-stop or other form of circuit isolation extending under the parts of the gate stripe 37 between the active gate parts 10 and 11. All these n type regions 48 are connected by a metallization track to a supply line at a positive potential (Vb) which may be substantially the same as the reset reference voltage level (Vr), for example 5 volts. Thus, when the associated capacitor 2 is reset the blooming-protection transistor 11 is in a hard off condition due to the significant effective negative potential of its gate, i.e. (Vi - Vr), for example about minus 4 volts, with respect to region 38.

If now a detector element 1 becomes forward biased and the potential of the associated capacitor 2 starts to go negative, the associated region 38 of the blooming-protection gate 11 will start to become negative. As a result, the effective gate potential Vi is now positive with respect to the region 38 so that the blooming-protection transistor formed by the gate 11 will start to conduct so coupling the capacitor 2 to the current supply 12. In this situation the supply 12 provides compensating current to the capacitor 2 to stabilize the potential of both the capacitor 2 and its detector element 1 at about zero volts by compensating for the excess photocurrent. In this way the tendency is avoided for excessive current at a detector element to forward bias the p-n junction of that element.

The same basic circuit operation of the device described with reference to FIG. 1 occurs in the device of FIG. 2, regarding its detector elements 1, injection gates 10, capacitor means 2, blooming-protection gates 11, addressing gates 7, common voltage-reading transistor 3, reset gate 5 and shift register 6. In the device of FIG. 2, however, two alternately-switchable capacitors 2a and 2b are associated with each detector element 1 so that while one capacitor (for example, 2a) is coupled to the source-follower transistor 3 for reading its potential after integration, the other capacitor (2b) is coupled to the detector element 1 for integrating its current signal. The switching arrangement of input gates 8a and 8b and output gates 9a and 9b permits each detector element 1 to be operated the whole time for photodetection without its signal being lost (i.e. not integrated) when reading the previous output from that element 1. Therefore, in the device of FIG. 2, all the detector elements 1 can stare at the scene at the same time. For the sake of convenience, only one element 1 and the corresponding input A is illustrated in FIG. 2.

Each of the first and second capacitors 2a and 2b may be formed in the same manner as for the device of FIG. 1. In the example illustrated in FIGS. 5 and 6, each capacitor 2a or 2b comprises an individual n type region 57 in the p type body portion 34. Each capacitor region 57 is insulated from an overlying metal stripe 52 (not shown in FIG. 5) which forms a common top earthed plate of all the capacitors 2a and 2b and which extends parallel to the injection gate stripe 10. However, if desired, an inverse capacitor structure having a common n type stripe 52 (in the body portion 34), and separate insulated gate plates 51a and 51b connected between n type side regions may be provided instead for each capacitor 2a and 2b, similar to that of FIGS. 3 and 4.

Figure 5:
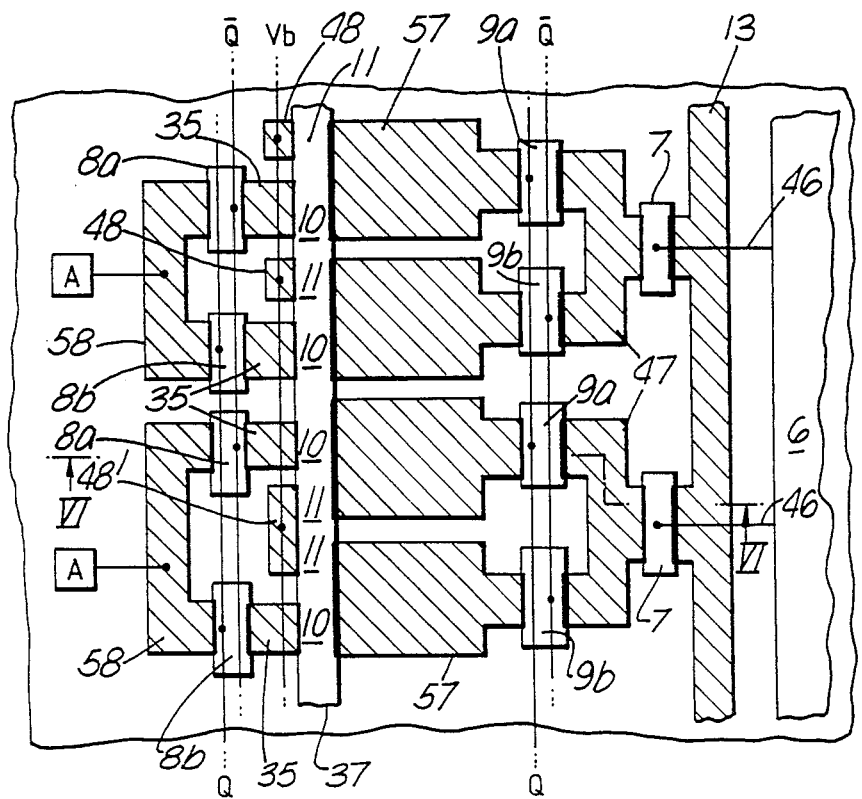
FIG. 5 is a plan view of part of the layout of FIG. 3, modified to provide alternately switchable storage capacitors as in FIG. 2.
Figure 6:
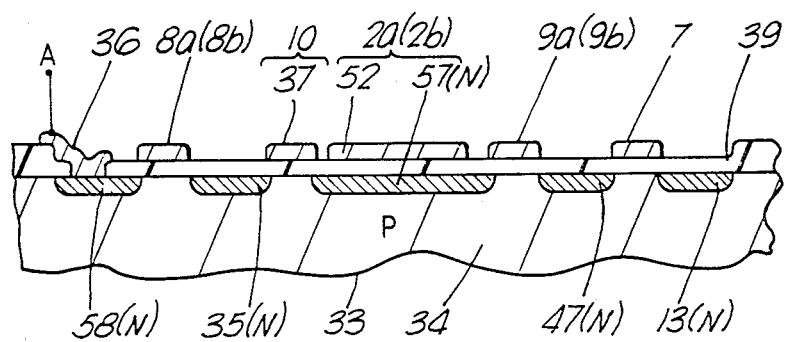
FIG. 6 is a cross-section on the line VI—VI of FIG. 5.

Separate insulated gates 9a and 9b are present between the n type regions 57 and the n type region 47 of each addressing transistor 7 to form the alternately switchable output gates. Similarly, instead of the input A being to the n type regions 35 of the injection gate transistors 10, each input A is to an n type region 58 which is coupled to the individual regions 35 for the capacitors 2a and 2b by insulated gates 8a and 8b forming the alternately switchable input gates. It is usually preferable to include the input gates 8a and 8b between the detector element input A and the injection gate 10 as illustrated in FIGS. 2, 5 and 6, rather than between the injection gate 10 and the capacitor means 2a and 2b, because a common injection gate stripe 37 in this latter position may introduce confusion between the input signals from the detector elements 1 due to the large capacitance of the gate stripe 37. Individual connection regions 48 for the blooming protection means may be provided for each capacitor 2a or 2b, or a more compact arrangement may be obtained by having common electrode connection regions 48' located between the gates 11 of each pair of capacitors 2a or 2b. In practice, either individual regions 48 or common regions 48' will normally be used for each pair 2a and 2b of capacitors in the device; however, both are illustrated for different capacitor pairs in FIG. 5 for the sake of convenience, rather than having two drawings.

As illustrated in FIG. 2, the switching arrangement 8a,8b,9a,9b is controlled by the inverse outputs 16 and 17 of one or more flip-flop circuits 18. One output signal $\bar{Q}$ (from 16) is the inverse of the other Q (from 17). Output 16 is connected to the input gate 8a and to the output gate 9b, whereas the output 17 is connected to the gate 8b and 9a. Thus, when Q is such as to switch on the transistors having the insulated gates to which it is applied, the capacitor 2a is coupled to the detector element 1 to integrate its current output but is isolated from the addressing gate 7 by the off state of the transistor switch having the insulated gate 9a, and the capacitor 2b is coupled to the addressing gate 7 but is isolated from the detector element 1 by the off state of the transistor switch having the insulated gate 8b.

Figure 7:
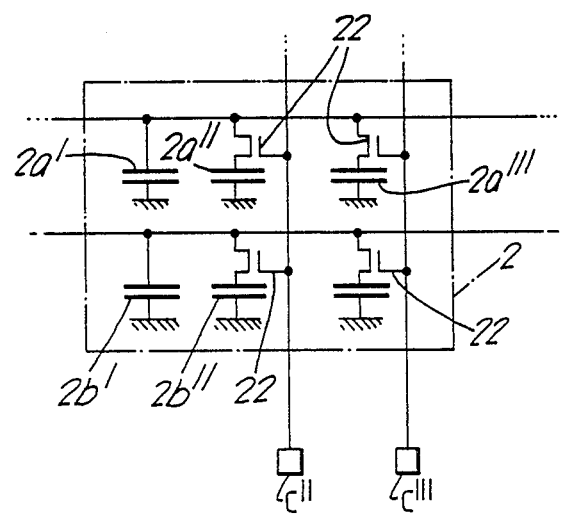
FIG. 7 illustrates a further modification of the capacitor means for a detector element in a device in accordance with the invention.

FIG. 7 illustrates a further modification for the capacitor means for each detector element input A. In this form, each of the first and the second capacitor means 2a and 2b in the alternate parallel arms of the FIG. 2 circuit comprises three capacitors (namely 2a', 2a", 2a''', and 2b', 2b", 2b''') connected in parallel. At least the capacitors 2a", 2a''', 2b" and 2b''' are coupled to the arms via transistor switches 22 the insulated gates of which are connected in pairs to control voltage sources C" and C'''. This allows each pair of capacitors (either 2a" and 2b", or 2a''' and 2b''') to be connected or disconnected from the other(s) so permitting a higher or lower total storage capacity to be obtained when so desired for the device application. This arrangement provides a more versatile signal processing circuit and can increase the dynamic range of the imaging device. The increased storage capacity obtained by connecting two or more capacitors (2a', 2a", 2a''') in parallel may be used when looking at a hotter scene or even a scene with a hot spot so that this increased storage capacity may even be used in cooperation with the blooming-protection means 11,12 to cope with excessive current from a detector element 1. Such increased storage capacity may also be employed when looking (i.e. integrating) for a longer time at a scene, since this also results in an increased signal from the detector elements. Another situation in which this facility can be useful is the fabrication of imaging devices operating at different infrared wavelengths. Thus, for example a large signal (for example up to 30 times more) can generally be obtained from a scene with cadmium mercury telluride detector elements 1 designed to operate in the 8 to 14 μm wavelength band rather than the 3 to 5 μm wavelength band. This variable capacitance facility (2a', 2a'', 2a''', 2b', 2b'', 2b''', 22) permits either type of detector element 1 to be coupled to the capacitor means 2 in a device in accordance with the invention. Although FIG. 7 illustrates three pairs of capacitors, similar devices may be designed with just two such pairs (for example 2a', 2b' and 2a'' and 2b'') for the device of FIG. 2, and in the case of FIG. 1 the capacitor 2 would be simply replaced by capacitors 2a', 2a'' and, if desired, 2a''' but without pairing.

In the devices so far described with reference to FIGS. 1 to 7, the row of capacitor means 2 has been coupled to a linear array of detector elements 1. It will be appreciated that many array variations of the devices of FIGS. 1 to 6 are possible within the scope of the invention. Thus, for example the detector elements 1 may be arranged in two rows or, for example, an alternately staggering row and may be located between two signal-processing circuit bodies 33, each having a row of capacitor means 2 so that the different rows of detector elements 1 or alternate detector elements 1 may be connected to the different bodies 33. In some devices the detector elements 1 may be provided on or even in the signal-processing circuit body 33. Furthermore, the signal-processing circuitry of imaging devices in accordance with the invention may be interfaced to a two-dimensional array of detector elements 1.

Figure 8:
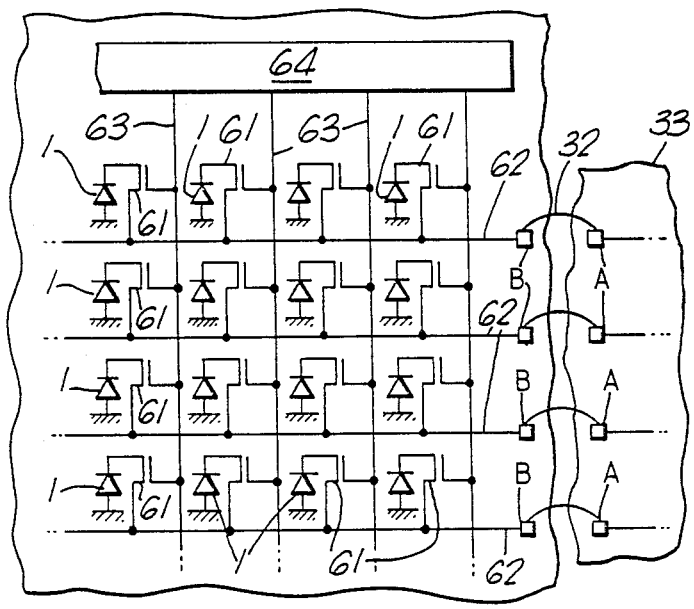
FIG. 8 is a circuit diagram of a two-dimensional array of detector elements and switches which may be incorporated as a modification in the device of FIG. 2.

FIG. 8 illustrates a two-dimensional array of photodiode detector elements 1 which are switchably connected via respective switches 61 to signals paths 62. Although only sixteen detector elements 1 and switches 61 are shown in FIG. 8, there will usually be many more, for example at least a 64×64 array or 128×128 array. The switches 61 may be insulated-gate field-effect transistors and are arranged in a two-dimensional array corresponding to that of the detector elements 1. Once again, the detector elements 1 may be of cadmium mercury telluride and they may be mounted by a variety of known techniques on a silicon circuit body comprising the switches 61 and signal paths 62. Two examples of suitable mounting and interconnection technologies are decribed in European patent application EP-A No. 0 061 803 which corresponds to U.S. Pat. No. 4,521,798 which describes the formation and connection of annular n type detector element regions around the side-walls of apertures in a p type body on a silicon circuit substrate, and in I.E.E.E. 1978 International Electron Devices Meeting, Washington D.C., pages 510 to 512 which describes indium bump connections between detector element regions at the bottom surface of an opposite conductivity type body also on a silicon circuit substrate.

The transistors 61 in each (horizontal) column are sequentially switched on by a pulse appearing sequentially on the outputs 63 of a shift register 64 which may be integrated into the same silicon circuit body as the switches 61. By this means, the detector elements 1 in each column are switched sequentially to the row of outputs B of the paths 62 which are connected to the inputs A of a signal processing circuit such as that shown in FIG. 2. When the array of FIG. 8 is connected to the circuit of FIG. 2, the signals from one line (vertical row) of detector elements 1 may be read from, for example, the capacitors 2a by the source-follower transistor 3 while the signals from the next line (vertical row) of detector elements 1 are being coupled to and integrated in the capacitors 2b. Thus, this imaging device has a line equivalent performance from each row of the two-dimensional array, with the same stare time (and integration time) for each detector element 1 in the line (vertical row). Since the individual switching transistors 61 and their connections can be fabricated with a very compact geometry it is possible to provide a large number of switches 61 and detector elements 1 in a closely packed array so that much larger arrays (in small areas) and higher spatial resolutions can be achieved with the imaging device of FIGS. 2 and 8, as compared with both CCD imaging devices and the FIG. 3 device of EP-A No. 0 128 828.

The array of FIG. 8 may be connected to the circuit of FIG. 1, if a pulse is applied to the injection gate 10 so as to isolate the capacitor 2 from the input A when its potential is being read by the transistor 3. However, the time for staring/integration would then be reduced by the time taken for scanning the line.

We claim:

1. An imaging device comprising (a) a plurality of photodetector elements which generate charge carriers in response to incident photon radiation, (b) charge-integration means coupled to each photodetector element for temporarily storing and so integrating charge generated at that detector element during an integration period, (c) signal-deriving means for deriving a signal from said charge-integration means in accordance with the amount of charge integrated at the charge-integration means, and (d) reset means for resetting the charge-integration means before the beginning of each integration period, characterised in that first and second charge-integration means are switchably coupled in alternate parallel arms between each detector element and the signal-deriving means by means of a switching arrangement which has input gates from the detector element and output gates to the signal-deriving means so permitting one of the first and second charge-integration means to be coupled to its detector element but isolated from the signal-deriving means while the other of the first and second charge-integration means is coupled to the signal deriving means but isolated from the detector element.

2. A device as claimed in claim 1, further characterised in that the detector elements are photovoltaic infrared detector elements operated in a zero-bias condition, and that, in addition to the input gates of said switching arrangement, an injection gate is present for controlling the radiation-generated charge signal injected from the detector elements to the charge-integration means so as to maintain the detector elements in the zero-bias condition.

3. A device as claimed in claim 2, further characterised in that the injection gate is included between the charge-integration means and its input gate.

4. A device as claimed in claim 1, further characterised in that the switching arrangement is controlled by the outputs of a flip-flop circuit.

5. A device as claimed in claim 4, further characterised in that a first output of the flip-flop circuit is connected to the input gate of the first charge-integration means and to the output gate of the second charge-integration means, and that an inverse second output of the flip-flop circuit is connected to the input gate of the second charge-integration means and to the output gate of the first charge integration means.

6. A device as claimed in claim 1, further characterised in that the plurality of detector elements are arranged as a two-dimensional array, the detector elements being switchably connected via respective switches in a two-dimensional array of switches to signal paths which are coupled to the charge-integration means at least via the input gates.

7. A device as claimed in claim 1, further characterised in that the first and second charge-integration means of each detector element each comprises at least two parallel-connected capacitor means, at least one of which has means permitting its connection to or disconnection from the other(s) so permitting a higher or lower total storage capacity to be obtained.

8. A device as claimed in claim 1, further characterised in that the first and second charge-integration means are capacitors to each of which blooming-protection means is coupled to inhibit inversion of the potential of the capacitor when the signal generated at the detector element exceeds a level sufficient to discharge fully the capacitor, that the blooming-protection means comprises first and second further gates which are associated with said first and second capacitors and are connected together to a common control voltage supply, and in that an electrode connection connected to a compensating-current supply is located between said first and second further gates, and so becomes coupled to either of the first and second capacitors when either of said first and second further gates becomes activated as a result of the first or second capacitors becoming fully discharged by excessive signal generated at the detector element.

9. A device as claimed in claim 1, further characterised in that the detector elements are of cadmium mercury telluride, and the charge-integration means and other signal-processing means for processing the signal from the detector elements are formed in at least one silicon circuit body.

* * * * *